US 10,404,266 B1

(12) United States Patent
Liaghati

(10) Patent No.: US 10,404,266 B1
(45) Date of Patent: Sep. 3, 2019

(54) DIFFERENTIAL PULSE-CODE MODULATION (DPCM) METHODS AND SYSTEMS FOR ENCODING CYCLIC DATA

(71) Applicant: The Boeing Company, Chicago, IL (US)

(72) Inventor: Amir Leon Liaghati, Huntsville, AL (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 16/149,962

(22) Filed: Oct. 2, 2018

(51) Int. Cl.
*H03M 3/04* (2006.01)
*H04L 25/06* (2006.01)
*H04L 25/02* (2006.01)
*H04L 25/03* (2006.01)

(52) U.S. Cl.
CPC ............ *H03M 3/04* (2013.01); *H04L 25/067* (2013.01); *H04L 25/0226* (2013.01); *H04L 25/03318* (2013.01)

(58) Field of Classification Search
CPC ............. H04L 25/067; H04L 25/0226; H04L 25/03318; H03M 3/04
See application file for complete search history.

(56) References Cited

U.S. PATENT DOCUMENTS

| 7,970,082 | B2 * | 6/2011 | Gunturi | H04L 27/2675 370/208 |
| 8,433,739 | B2 * | 4/2013 | Ha | H04B 14/006 708/200 |
| 2004/0146106 | A1 * | 7/2004 | De Lameillieure | H03M 7/30 375/240.12 |
| 2013/0207824 | A1 * | 8/2013 | Waters | H03M 1/12 341/155 |

OTHER PUBLICATIONS

Simkus et al., "Ultra-low delay lossy audio coding using DPCM and block companded quantization," 2013 Australian Communications Theory Workshop, IEEE, pp. 43-46.
Mansour et al., "Simulation of DPCM and ADM Systems," 2012 14th International Conference on Modelling and Simulation, IEEE Computer Society, pp. 416-421.

* cited by examiner

*Primary Examiner* — Jean B Corrielus
(74) *Attorney, Agent, or Firm* — MH2 Technology Law Group LLP

(57) ABSTRACT

A method includes receiving a first cycle of an original cyclic signal. One or more cyclic parameters of the first cycle of the original cyclic signal are estimated. The original cyclic signal is predicted in counts, based at least partially upon the one or more cyclic parameters and one or more sensor parameters, to produce a predicted cyclic signal that corresponds to the original cyclic signal. The predicted cyclic signal includes biased, dual-state, differential pulse-code modulation (DPCM) data. A second cycle of the original cyclic signal is predicted based upon the predicted cyclic signal.

25 Claims, 10 Drawing Sheets

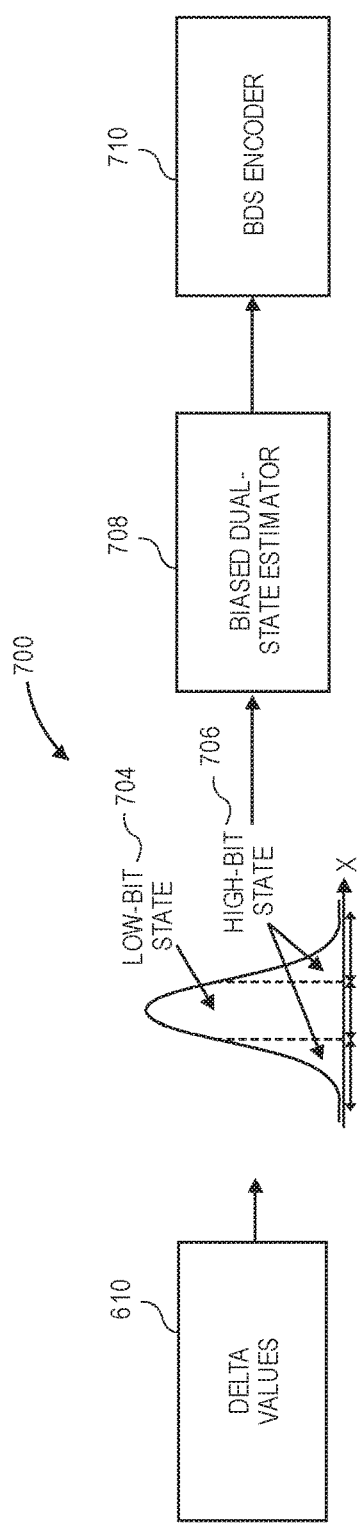
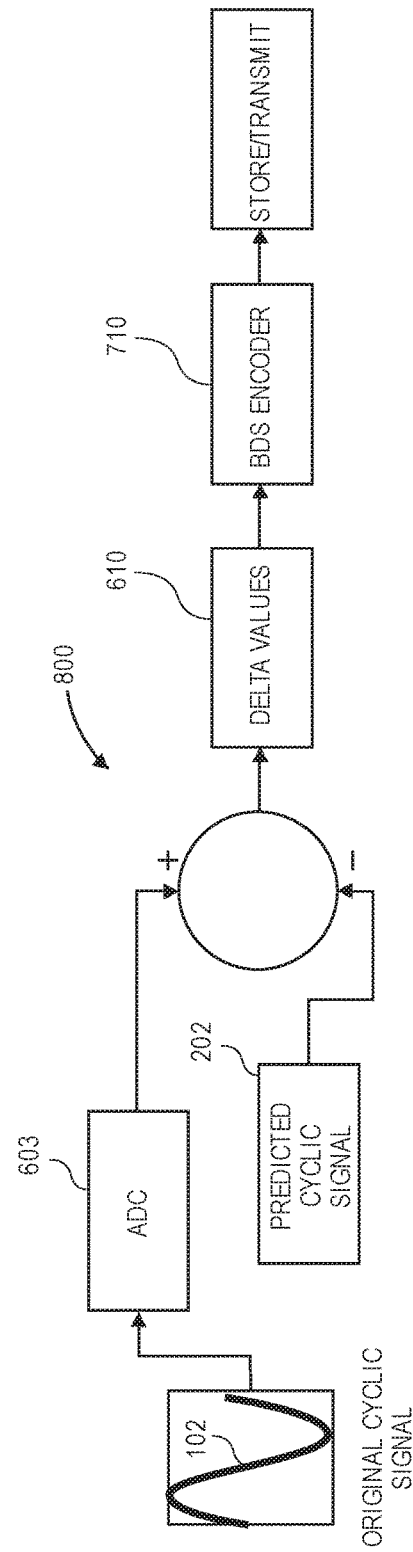
FIG. 7
FIG. 8

| Original Data Cycle 1 | Predictor Parameters Cycle 2 | Dual-State Parameters Cycle 2 | Delta Cycle 2 |
| --- | --- | --- | --- |
| | Predictor Parameters Cycle 3 | Dual-State Parameters Cycle 3 | Delta Cycle 3 |

· · · · ·

| Original Data Cycle n | Predictor Parameters Cycle (n+1) | Dual-State Parameters Cycle (n+1) | Delta Cycle (n+1) |
| --- | --- | --- | --- |
| | Predictor Parameters Cycle (n+1) | Dual-State Parameters Cycle (n+1) | Delta Cycle (n+1) |

DIFFERENTIAL PULSE-CODE MODULATION (DPCM) METHODS AND SYSTEMS FOR ENCODING CYCLIC DATA

FIELD OF THE DISCLOSURE

The present disclosure is directed to systems and methods for transmitting data. More particularly, the present disclosure is directed to systems and methods for compressing and transmitting cyclic data.

BACKGROUND

Differential pulse-code modulation (DPCM) is a signal encoder that uses the baseline of pulse-code modulation (PCM) but adds some functionalities based on the prediction of the samples of the signal. The input can be an analog signal or a digital signal. If the input is a continuous-time analog signal, it may be sampled first so that a discrete-time signal is the input to the DPCM encoder.

A first option is to take the values of two consecutive samples. If they are analog samples, they may be quantized. The difference between the first one and the next one is then calculated, and the output is the difference. In a second option, instead of taking a difference relative to a previous input sample, the difference relative to the output of a local model of the decoder process may be taken. The difference may be quantized, which allows the user to incorporate a controlled loss in the encoding.

DPCM may be used to transmit data over constrained communications links. The constraints may be experienced during, for example, satellite transfer orbit operations, where communication links are impacted by dynamic orbits, distance, link budgets, etc. Data measured and/or transmitted by a satellite may be cyclic (e.g., in the form of a sine or cosine wave). What is needed is an improved system and method for compressing and transmitting cyclic data (e.g., using DPCM encoding).

SUMMARY

A method includes receiving a first cycle of an original cyclic signal. The method also includes estimating one or more cyclic parameters of the first cycle of the original cyclic signal. The method also includes predicting the original cyclic signal in counts, based at least partially upon the one or more cyclic parameters and one or more sensor parameters, to produce a predicted cyclic signal that corresponds to the original cyclic signal. The predicted cyclic signal includes biased, dual-state, differential pulse-code modulation (DPCM) data. The method also includes predicting a second cycle of the original cyclic signal based upon the predicted cyclic signal.

In another implementation, the method includes receiving a first cycle of an original cyclic signal. The method also includes estimating one or more cyclic parameters of the first cycle of the original cyclic signal. The one or more cyclic parameters include a sine function or a cosine function that corresponds to the original cyclic signal. The method also includes predicting the original cyclic signal in counts, based at least partially upon the one or more cyclic parameters and one or more sensor parameters, to produce a predicted cyclic signal that corresponds to the original cyclic signal. The predicted cyclic signal includes biased, dual-state, differential pulse-code modulation (DPCM) data. The one or more sensor parameters are selected from the group consisting of a maximum voltage of the original cyclic signal, a minimum voltage of the original cyclic signal, a sampling frequency of the original cyclic signal, a number of bits of an analog-to-digital converter (ADC) that processes the original cyclic signal, and a combination thereof. The method also includes predicting a second cycle of the original cyclic signal based upon the predicted cyclic signal. The method also includes determining one or more delta values of the original cyclic signal that represent differences between the first cycle of the predicted cyclic signal and the second cycle of the original cyclic signal.

In yet another implementation, the method includes receiving a first cycle of an original cyclic signal that is measured by one or more sensors on a satellite in orbit. The method also includes estimating one or more cyclic parameters of the first cycle of the original cyclic signal. The one or more cyclic parameters include a cosine function that corresponds to the original cyclic signal. The cosine function is represented by $A \cos \omega t + \theta$, where A represents magnitude, $\omega$ represents frequency, t represents time, and $\theta$ represents phase. The method also includes predicting the original cyclic signal in counts, based at least partially upon the one or more cyclic parameters and one or more sensor parameters, to produce a predicted cyclic signal that corresponds to the original cyclic signal. The predicted cyclic signal includes biased, dual-state, differential pulse-code modulation (DPCM) data. The predicted cyclic signal includes at least 3 times fewer bits than the original cyclic signal. The one or more sensor parameters are selected from the group consisting of a maximum voltage of the original cyclic signal, a minimum voltage of the original cyclic signal, a sampling frequency of the original cyclic signal, a number of bits of an analog-to-digital converter (ADC) that processes the original cyclic signal, and a combination thereof. The method also includes predicting a second cycle of the original cyclic signal based upon the predicted cyclic signal. The method also includes determining one or more delta values of the original cyclic signal that represent the first cycle of the predicted cyclic signal subtracted from the second cycle of the original cyclic signal.

A system is also disclosed. The system includes a sensor configure to measure a first cycle of an original cyclic signal. The system also includes a computing system configured to receive the first cycle of the original cyclic signal from the sensor. The computing system includes one or more processors and a memory system. The memory system includes one or more non-transitory computer-readable media storing instructions that, when executed by at least one of the one or more processors, cause the computing system to perform operations. The operations include estimating one or more cyclic parameters of the first cycle of the original cyclic signal. The operations also include predicting the original cyclic signal in counts, based at least partially upon the one or more cyclic parameters and one or more sensor parameters, to produce a predicted cyclic signal that corresponds to the original cyclic signal. The predicted cyclic signal includes biased, dual-state, differential pulse-code modulation (DPCM) data. The operations also include predicting a second cycle of the original cyclic signal based upon the predicted cyclic signal.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate aspects of the present teachings and together with the description, serve to explain the principles of the present teachings.

FIG. 1 illustrates a graph including an original cyclic signal, according to an implementation.

FIG. 7 illustrates a flowchart of a method for generating a dynamic probabilistic biased dual-state estimator, according to an implementation.

FIG. 8 illustrates a flowchart of a method for cyclic compression, according to an implementation.

FIG. 11 illustrates a flowchart of a method for cyclic-biased dual-state DPCM encoding formatting, according to an implementation.

Figure 1:
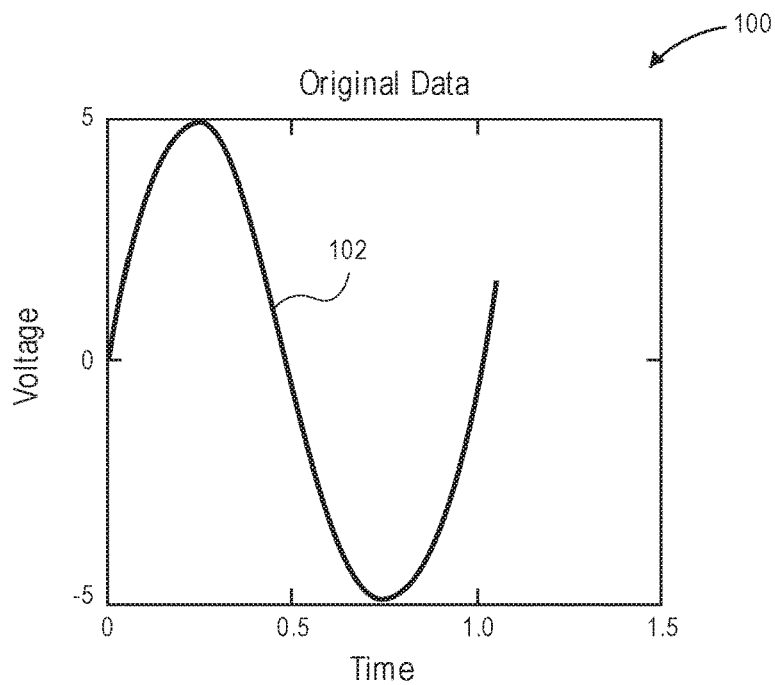

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

The systems and methods disclosed herein predict input data for a cyclic (e.g., waveform-type) signal and adjust the encoding thereof. More particularly, the systems and methods disclosed herein may improve digital transmission speed by implementing a biased, dual-state (BDS) encryption and improve the throughput of the data by ordering it and removing transition latencies. As a result, the transmission speed may be faster. This may be accomplished by calculating delta values, which includes dynamic encoding that is based on the signal. Conventional systems and methods, in contrast, make no attempt to predict the cyclic nature of the input data. In the systems and methods disclosed herein, no lookup table is required because the values change often. The probability of error occurring decreases, because the delta values are between prediction values and the actual values, and therefore, the delta values are independent from each other. As a result, propagation of any errors may be reduced or altogether avoided. The encoding is dynamic, and it is not pre-defined. The machine learns from cycles during the flight mission and selects the best states, and encoding schemes.

FIG. 1 illustrates a graph 100 including an original cyclic signal 102 (e.g. original cyclic data), according to an implementation. More particularly, the graph 100 represents a first cycle of an original cyclic signal 102. As used herein, "cyclic data" or a "cyclic signal" refers to data (or a signal) that is substantially repetitive over a plurality of cycles (e.g., in the form of a sine or cosine wave). The original cyclic signal 102 may be measured by one or more sensors. In at least one implementation, the sensor(s) may be part of a satellite in orbit, and the original cyclic signal 102 may be or include voltage vs. time (as shown in the graph 100), current vs. time, power vs. time, sensor measurements (e.g., temperature, light, etc.), and the like.

Figure 2:
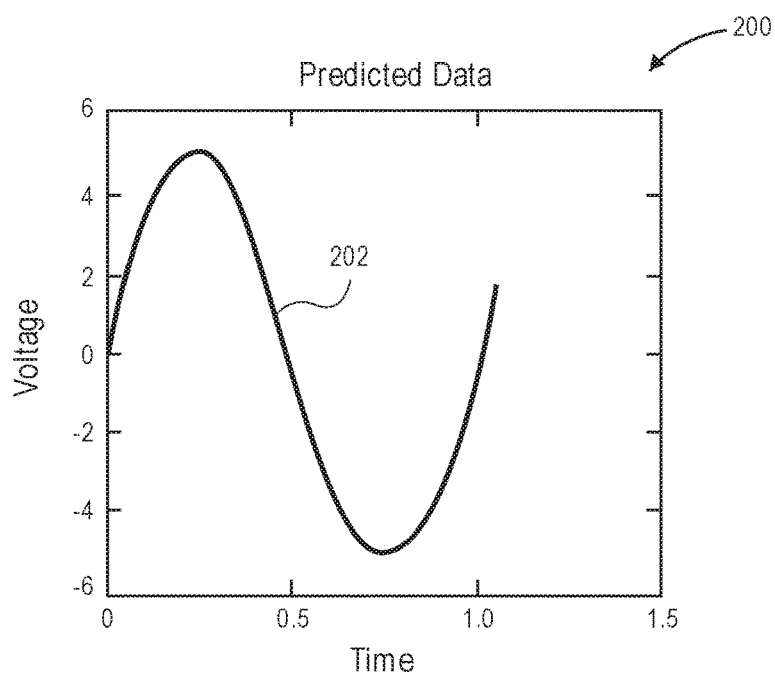
FIG. 2 illustrates a graph including a predicted cyclic signal, according to an implementation.

FIG. 2 illustrates a graph 200 including a predicted cyclic signal 202, according to an implementation. The predicted cyclic signal 202 (also referred to as an estimated cyclic signal and/or a predictor) may be or include biased, dual-state, differential pulse-code modulation (DPCM) data that represents/corresponds to the original cyclic signal 102. As used herein, "biased" refers to the probability that the low-bit state is higher, as discussed in greater detail below. As used herein, "dual-state" refers to two states that are used to encode the delta values. As described below, the predicted cyclic signal 202 may be represented using fewer bits than the original cyclic signal 102. Thus, the predicted cyclic signal 202 may be transmitted (e.g., from a satellite in orbit to a receiver on Earth) instead of the original cyclic signal 102 because the predicted cyclic signal 202 may be transmitted more quickly and/or using less bandwidth.

Figure 3:
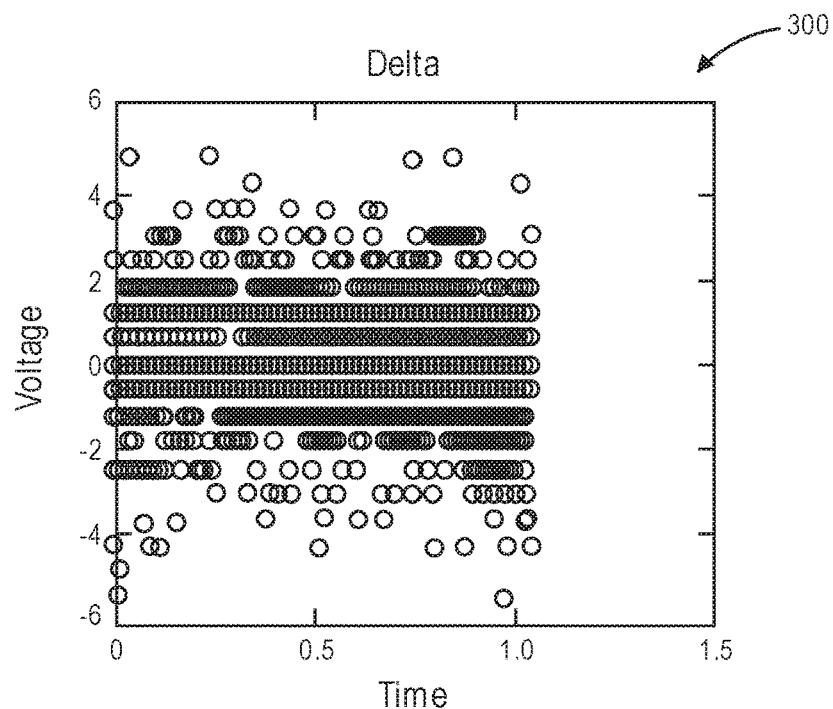
FIG. 3 illustrates a graph showing differences (i.e., delta values) between the original cyclic signal and the predicted cyclic signal, according to an implementation.
Figure 4:
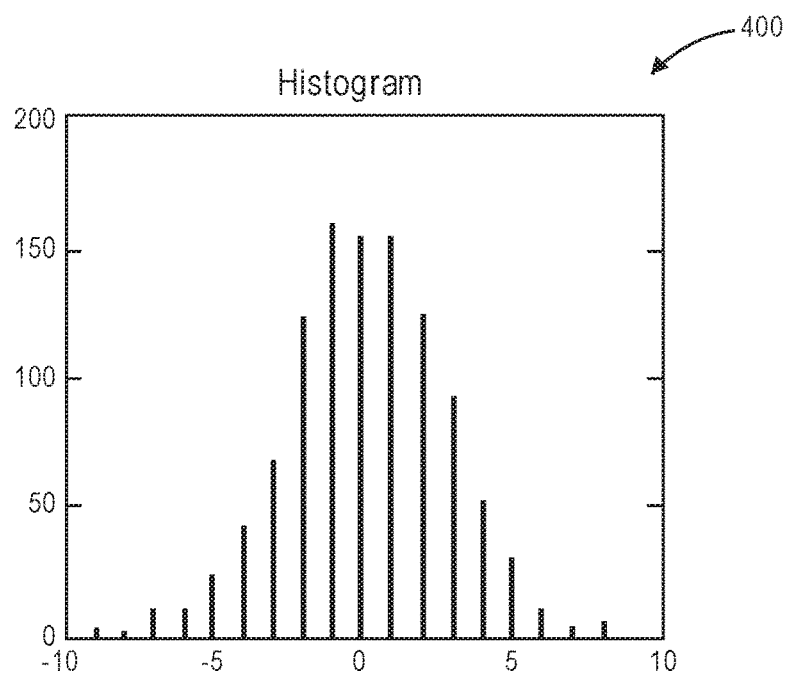
FIG. 4 illustrates a histogram of the delta values, according to an implementation.

FIG. 3 illustrates a graph 300 showing differences (i.e., delta values) between the original cyclic signal 102 and the predicted cyclic signal 202, according to an implementation. The delta values may be obtained by subtracting the predicted cyclic signal 202 from the original cyclic signal 102 (or vice versa) at a plurality of time intervals. The delta values may be represented in a histogram 400, as shown in FIG. 4.

Figure 5:
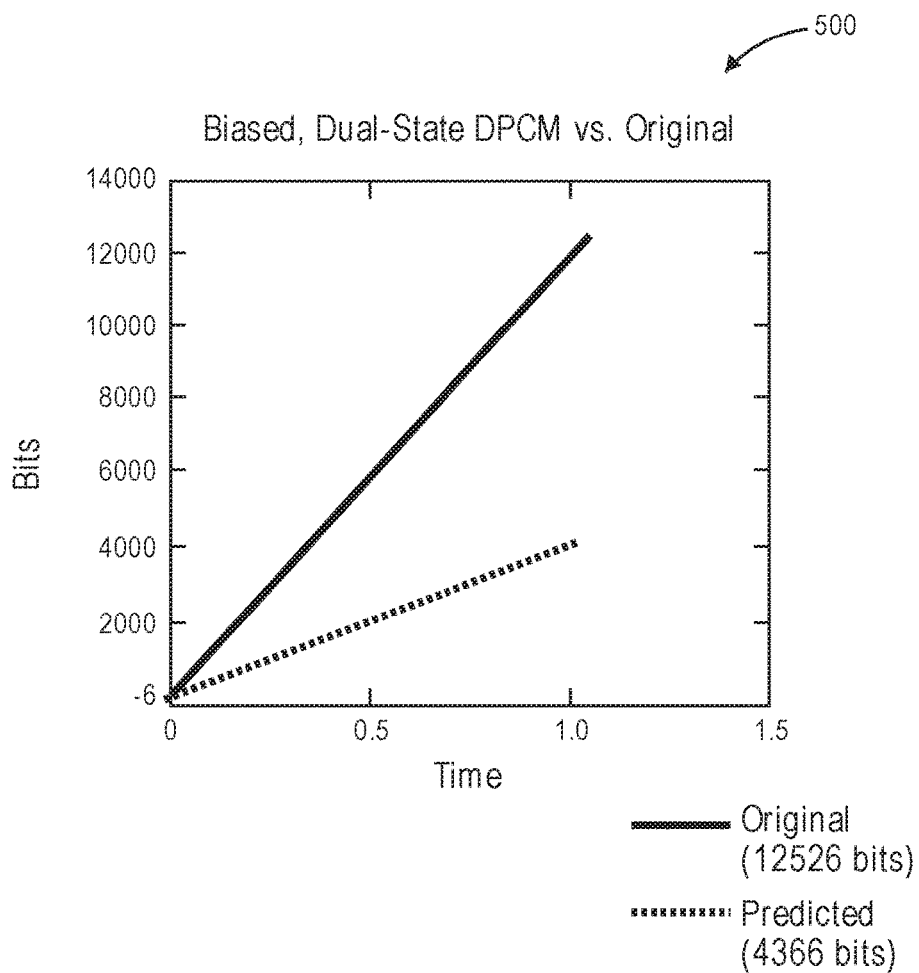
FIG. 5 illustrates a graph showing the number of bits needed to transmit the original cyclic signal and the predicted cyclic signal, according to an implementation.

FIG. 5 illustrates a graph 500 showing the number of bits needed to transmit the original cyclic signal 102 and the predicted cyclic signal 202, according to an implementation. As mentioned above, the predicted cyclic signal 202 may be transmitted using fewer bits than the original cyclic signal 102. In this example, the original cyclic signal 102 is transmitted using 12,526 bits, and the predicted cyclic signal 202 is transmitted using 4,366 bits. Thus, the predicted cyclic signal 202 may be transmitted about 3-times (e.g. 3×) as fast as the original cyclic signal 102 and/or using 3-times less bandwidth.

Figure 6:
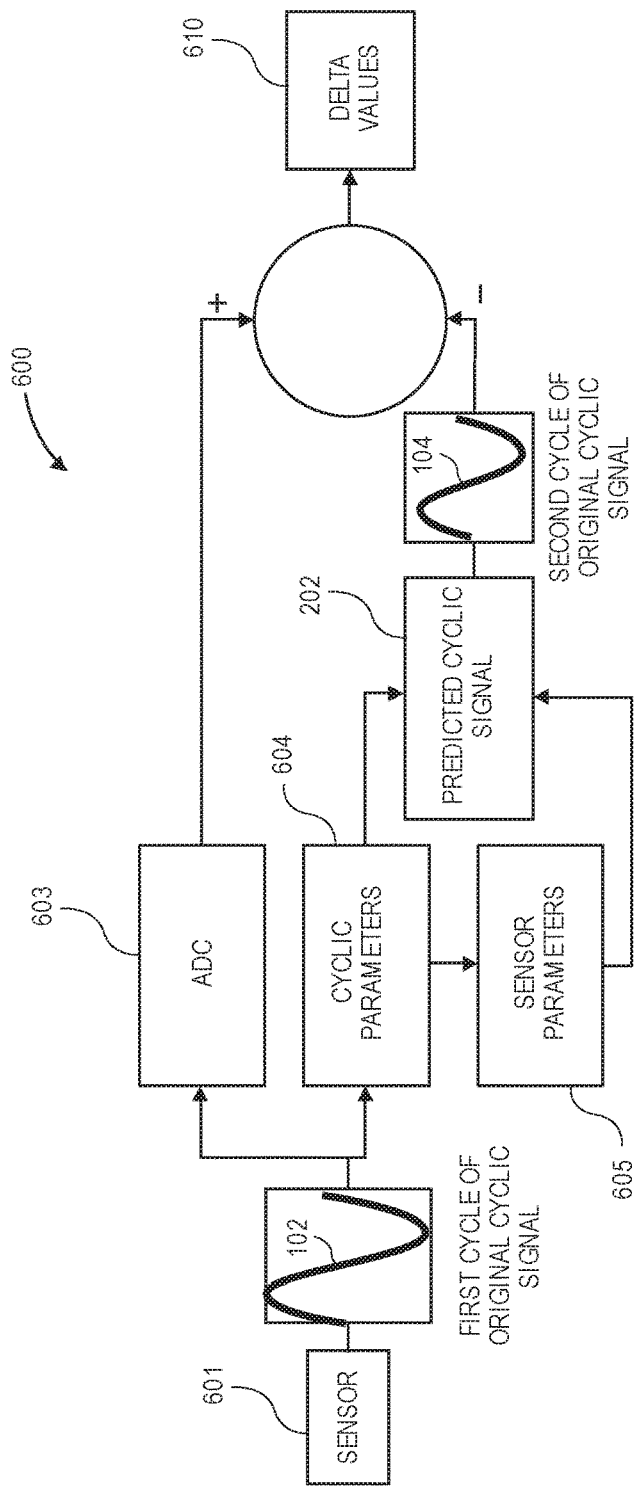
FIG. 6 illustrates a flowchart of a method for constructing the predicted cyclic signal and extracting delta values, according to an implementation.

FIG. 6 illustrates a flowchart of a method 600 for constructing the predicted cyclic signal 202 and extracting delta values, according to an implementation. As shown, the method 600 includes receiving and providing a measurement of (at least a portion of) a first cycle of the original cyclic signal 102. The original cyclic signal 102 may be measured by a sensor 601, as discussed above. The original cyclic signal 102 may be introduced to an analog-to-digital converter (ADC) 603 and/or used to estimate one or more cyclic parameters of the first cycle, as at 604. The cyclic parameter(s) may include a sine function or a cosine function that corresponds to/closely resembles the original cyclic signal 102 (e.g., A cos ωt+θ), where A represents magnitude, ω represents frequency (or 2πf where f is the frequency), t represents time, and θ represents phase.

The method 600 also includes predicting the original cyclic signal 102 in counts (in the digital domain), based at least partially upon the one or more cyclic parameters and one or more sensor parameters 605, to produce the predicted cyclic signal 202 that corresponds to the original cyclic signal 102. The predicted cyclic signal 202 may also be referred to as a predictor or the original cyclic signal 102 estimated in counts. The sensor parameter(s) may be or include a maximum voltage of the original cyclic signal 102, a minimum voltage of the original cyclic signal 102, a sampling frequency of the original cyclic signal 102, a number of bits of the analog-to-digital converter (ADC) 603 that processes the original cyclic signal 102, or a combination thereof.

The method 600 also includes predicting a second cycle of the original cyclic signal 104 based upon the predicted cyclic signal 202. The method 600 also includes determining (e.g., extracting) one or more delta values 610 that represent differences (e.g. deltas) between the first cycle of the predicted cyclic signal 202 and the second cycle of the original cyclic signal 104. More particularly, the first cycle of the predicted cyclic signal 202 (i.e., the predictor) may be subtracted from the second cycle of the original cyclic signal 104 to produce the delta values 610.

FIG. 7 illustrates a flowchart of a method 700 for generating a dynamic, probabilistic, biased, dual-state estimator 708 for updating a biased, dual-state (BDS) encoder 710 based on the delta values 610 and low/high-bit states 704, 706, according to an implementation. The method 700 may be related to and/or build off of the method 600. The method 700 may include determining a low-bit state 704 of the original cyclic signal 102 and a high-bit state 706 of the original cyclic signal 102 based at least partially upon the one or more delta values 610. The low-bit state 704 may be represented by $\mu-\tau<x<\tau$, and the high-bit state 706 may be represented by $$\begin{cases} x < \mu - \tau \\ x > \mu + \tau \end{cases},$$

where μ represents a mean or peak value of the one or more delta values 610, τ represents a boundary threshold, and x represents one of the one or more delta values 610 to be encoded. In at least one implementation, the low-bit state 704 and/or the high-bit state 706 may not be fixed and may change dynamically with each cycle of the original cyclic signal 102. In another implementation, the low-bit state 704 and/or the high-bit state 706 may not be pre-fixed and may change in response to the one or more delta values 610 changing.

FIG. 8 illustrates a flowchart of a method 800 for cyclic compression, according to an implementation. The method 800 may be related to and/or build off of the method 600 and/or the method 700. The method 800 may include using the BDS encoder 710 to encode the one or more delta values 610 for the second cycle of the original cyclic signal 104. More particularly, the encoder 710 may encode the delta values 610 between the first cycle of the estimated signal 202 (i.e., the predictor) and the second cycle of the original cyclic signal 104. The predictor from cycle n may be used for the cycle n+1 to M many cycle(s), and the process may repeat. The encoder 710 may include probabilistic parameters (e.g., from FIG. 7) and/or dual-state information as part of a header for the M many cycle(s).

Figure 9:
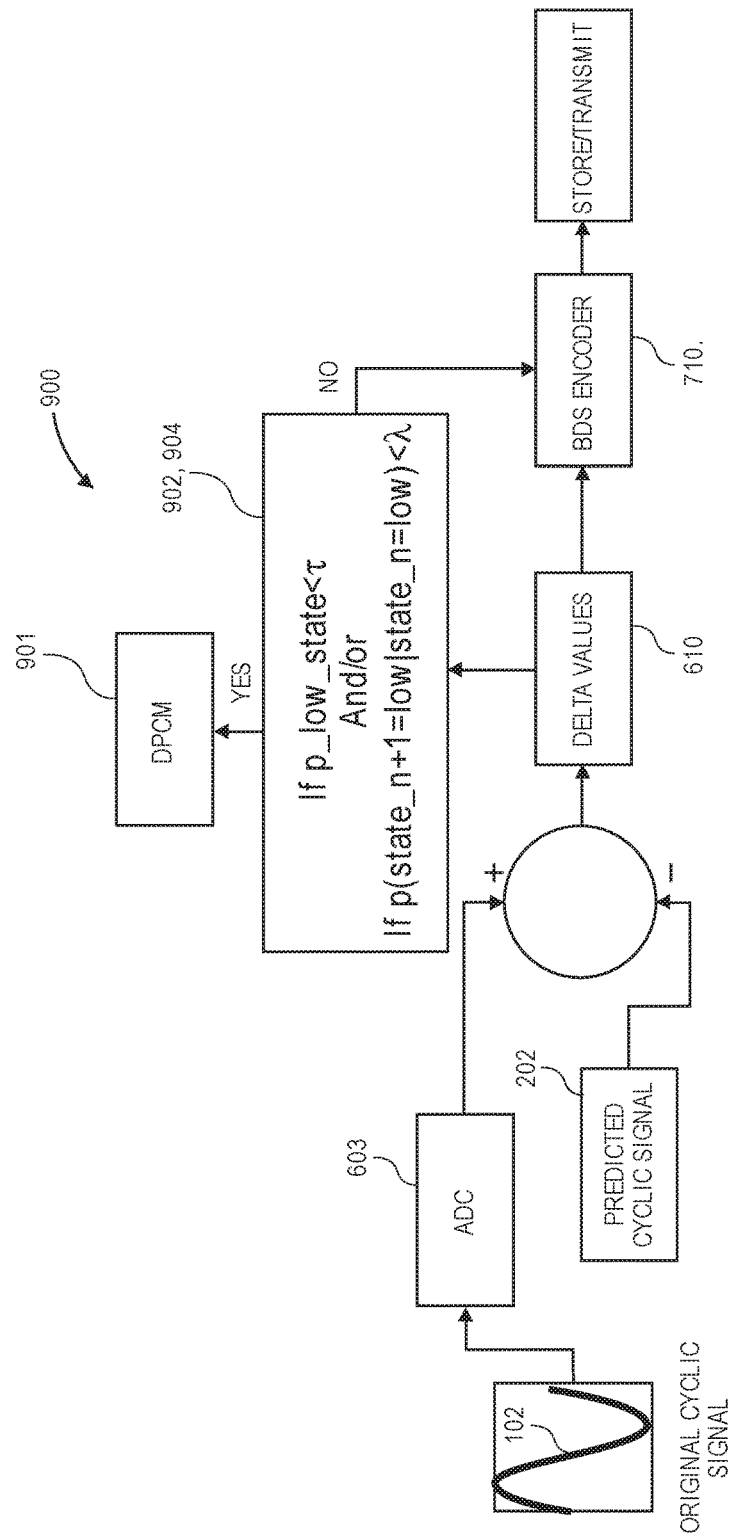
FIG. 9 illustrates a flowchart of a method for generating a dual-mode encoder determined by collected statistics of state transitions, according to an implementation.

FIG. 9 illustrates a flowchart of a method 900 for generating a dual-mode encoder determined by collected statistics of state transitions, according to an implementation. The method 900 may be related to and/or build off of the method(s) 600, 700, and/or 800. The encoder 710 may determine if the BDS method is not suitable by collecting statistics and determining the probability of the low-bit state 704 and transition probability for each cycle. As used herein, transition probability refers to a probability of transition between two states (e.g., low-bit and high-bit). The method 900 may include switching the encoder 710 to a DPCM with a fixed-bit format in response to a probability of the low-bit state 704 being less than τ, as at 902. In another implementation, the method 900 may include switching the encoder to a DPCM with a fixed-bit format in response to a probability of (state_n+1=low|state_n=low) being less than λ, where λ, represents a threshold, as at 904. If the switch to the DPCM takes place, the encoder 710 may notify the decoder.

Figure 10:
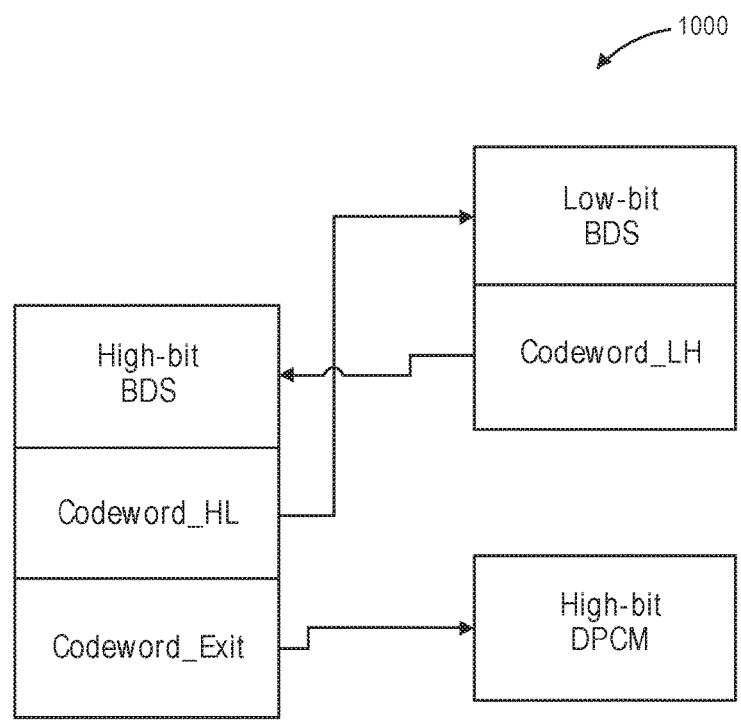
FIG. 10 illustrates a flowchart of a method for codeword-based switching between biased, dual-state (BDS) and DPCM, according to an implementation.

FIG. 10 illustrates a flowchart of a method 1000 for codeword-based switching between BDS and DPCM, according to an implementation. The method 1000 may be related to and/or build off of the method(s) 600, 700, 800, and/or 900. A new codeword may be introduced in a high-bit format. For example, for an 8-bit codeword, the Codeword HL is −128, and the new Codeword_Exit is 127. If the cycle ends with a low-bit delta, the method 1000 may switch to high-bit using Codeword_LH and then use New Codeword_Exit to switch. The boundaries −128 and 127 are fixed for codewords, and the probability of those delta(s) happening is/are 0. If the cycle ends with a high-bit delta, the method may use Codeword_Exit to switch to DPCM.

FIG. 11 illustrates a flowchart of a method 1100 for cyclic-biased, dual-state, DPCM encoding formatting, according to an implementation. The method 1100 may be related to and/or build off of the method(s) 600, 700, 800, 900, and/or 1000. The first cycle of the original cyclic signal 102 may be transmitted (e.g., DPCM compression with fixed data rate may be optional). The original cyclic signal 102 may also be stored in a memory buffer, and the predicted cyclic signal 202 may be generated, as discussed above. The cyclic parameters 604 for the predicted cyclic signal 202 may then be formatted (e.g., magnitude, phase, frequency, etc.). Instead of transmitting the entire predicted cyclic signal 202, in at least one implementation, only a few parameters may be transmitted. The decoder may then reconstruct the predicted cyclic signal 202 based on these parameters.

Next, the dual-state parameters may be formatted. The delta value(s) 610 may be extracted between the predicted cyclic signal 202 and the original cyclic signal 102 (as mentioned above), and the low-bit state 704 and the high-bit state 706 may be determined. As a result, the encoder 710 may transmit the information to the decoder. For example, if the high-bit state 706 is 8 bits, and the low-bit state 704 is 4 bits, the parameters may be 8 and 4. In at least one implementation, only 8 bits may be used for these parameters, 4 bits for the low-bit state 704 and 4 bits for the high-bit state 706.

Next, the delta values 610 may be encoded using the biased, dual-state encoder 710. The delta values 610 for each cycle may have a variable length. However, the decoder may know where the samples start and finish for the next cycle. A new codeword may be added to the encoder for exiting the BDS.

In the next cycle, only the cyclic parameters, the dual-state parameters, and the encoded delta values may be transmitted. The process may continue until the original cycle is transmitted again at the beginning. The transmission of the original cycle may be fixed (e.g., every N cycle(s), transmit the original cycle). In another implementation, the original cycle may be variable, where the distribution of delta values and/or the transitional probability may be used to decide when to transmit the original cycle.

Upon receiving the data, the decoder may read the first cycle. The first cycle may be compressed and/or not match the encoder 710. The decoder may then read the cyclic parameters and reconstruct the predicted cyclic signal 202, which may, in one implementation, be a sine wave with different frequency, magnitude, etc.

Once the decoder constructs the predicted cyclic signal 202, the decoder may read the dual-state parameters. After reading the dual-state parameters, the decoder may know what states are used and start decoding the delta values 610. Once the delta values 610 have been decoded, the decoder may also reconstruct the original data (e.g., simultaneously). The decoder may continue decoding until it is time to decode the original cycle again. The decoder and the encoder 710 may share the same mode between variable or fixed transmission of the original signal. The decoder may exit out of the BDS by reading the new codeword between the encoder and the decoder.

Figure 12:
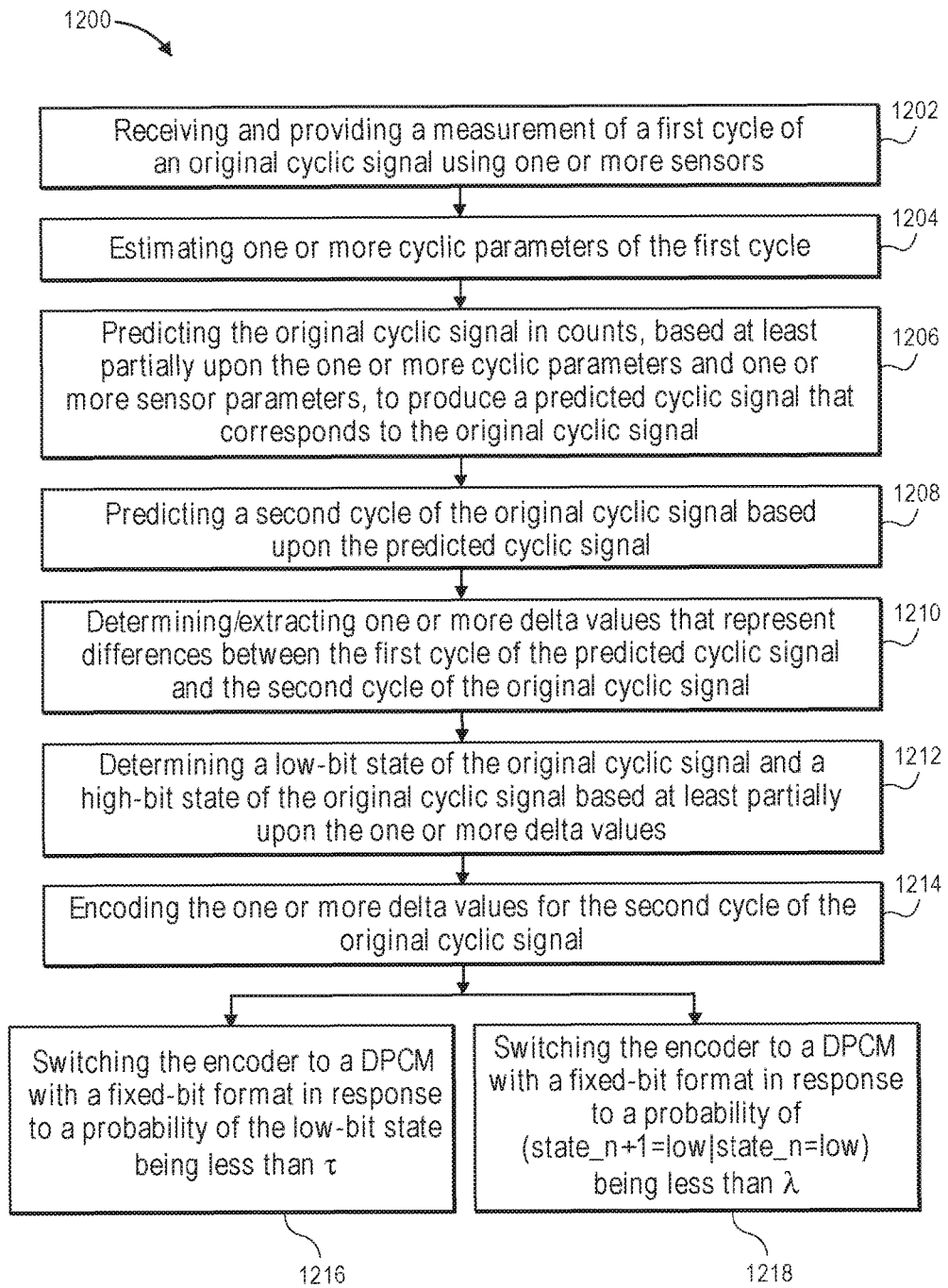
FIG. 12 illustrates a flowchart of a method for compressing and transmitting data, according to an implementation.

FIG. 12 illustrates a flowchart of a method 1200 for compressing and transmitting data, according to an implementation. The method 1200 may be similar to one or more of the methods described above. The method 1200 may include receiving and providing a measurement of a first cycle of an original cyclic signal 102 using one or more sensors 610 (e.g., on a satellite in orbit), as at 1202. The method 1200 also includes estimating one or more cyclic parameters 604 of the first cycle of the original cyclic signal 102, as at 1204. The method 1200 also includes predicting the original cyclic signal 102 in counts (e.g. in the digital domain), based at least partially upon the one or more cyclic parameters 604 and one or more sensor parameters 605, to produce a predicted cyclic signal 202 that corresponds to the (first cycle of the) original cyclic signal 102, as at 1206. The method 1200 also includes predicting a second cycle of the original cyclic signal 104 based upon the predicted cyclic signal 202, as at 1208. The method 1200 also includes determining (e.g., extracting) one or more delta values 610 that represent differences between the first cycle of the predicted cyclic signal 202 and the second cycle of the original cyclic signal 104, as at 1210.

The method 1200 may also include determining a low-bit state 704 of the original cyclic signal 102 and a high-bit state 706 of the original cyclic signal 102 based at least partially upon the one or more delta values 610, as at 1212. The method 800 may also include encoding the one or more delta values 610 for the second cycle of the original cyclic signal 104, as at 1214.

The method 1200 may include switching the encoder 710 to a DPCM with a fixed-bit format in response to a probability of the low-bit state 704 being less than τ, as at 1216. In another implementation, the method 1200 may include switching the encoder 710 to a DPCM with a fixed-bit format in response to a probability of (state_n+1=low|state_n=low) being less than λ, where λ, represents a threshold, as at 1218.

Figure 13:
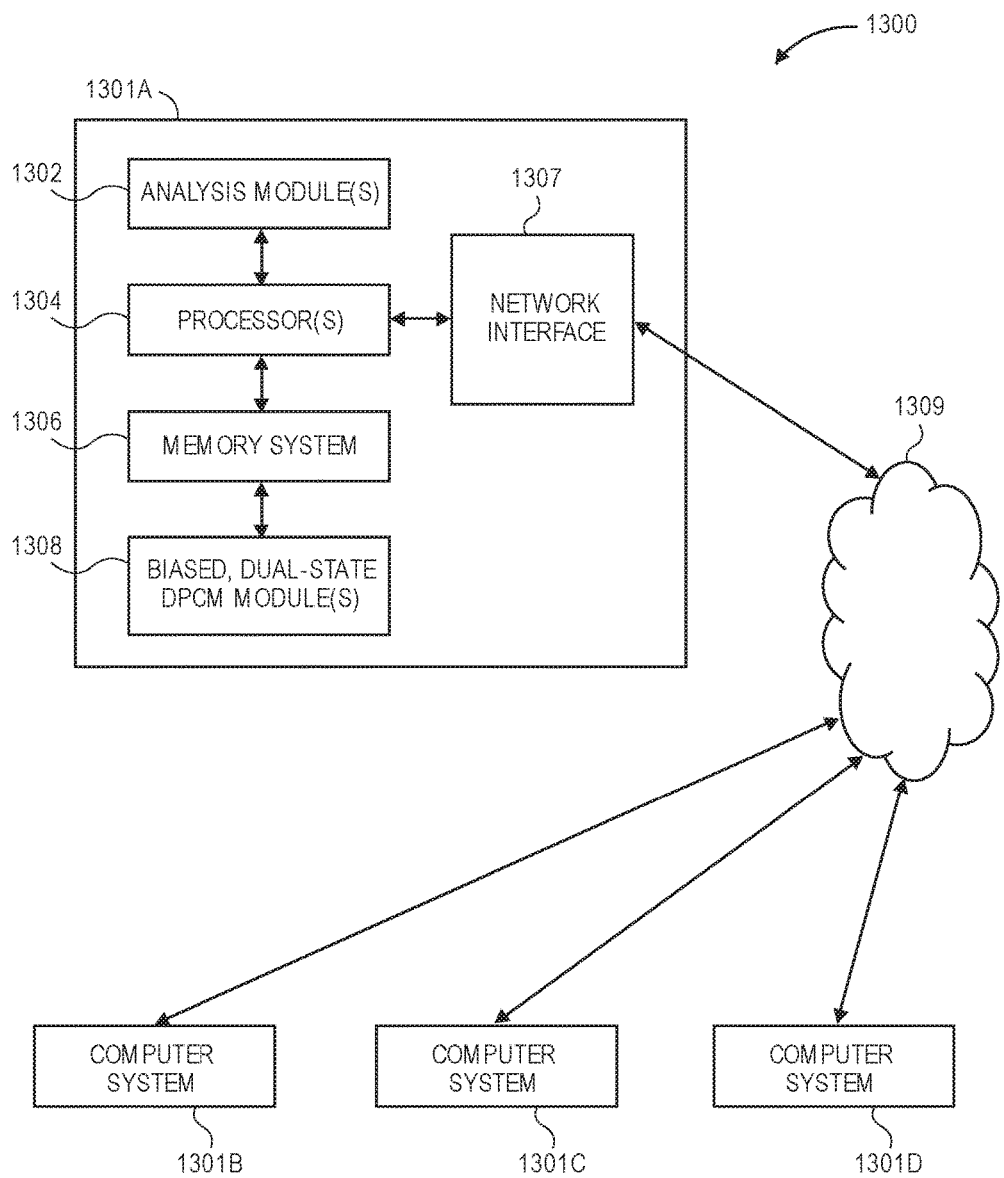
FIG. 13 illustrates a schematic view of a computing system for performing at least a portions of the method(s) disclosed herein, according to an implementation.

FIG. 13 illustrates a schematic view of a computing system 1300, according to an implementation. The computing system 1300 may include a computer or computer system 1301A, which may be an individual computer system 1301A or an arrangement of distributed computer systems. The computer system 1301A includes one or more analysis module(s) 1302 configured to perform various tasks according to some implementations, such as one or more methods disclosed herein. To perform these various tasks, the analysis module 1302 executes independently, or in coordination with, one or more processors 1304, which is (or are) connected to one or more memory systems 1306 comprising one or more non-transitory computer readable storage media. The processor(s) 1304 is (or are) also connected to a network interface 1307 to allow the computer system 1301A to communicate over a data network 1309 with one or more additional computer systems and/or computing systems, such as 1301B, 1301C, and/or 1301D (note that computer systems 1301B, 1301C and/or 1301D may or may not share the same architecture as computer system 1301A, and may be located in different physical locations, e.g., computer systems 1301A and 1301B may be located in a processing facility, while in communication with one or more computer systems such as 1301C and/or 1301D that are located in one or more data centers, and/or located in varying countries on different continents).

A processor can include a microprocessor, microcontroller, processor module or subsystem, programmable integrated circuit, programmable gate array, or another control or computing device.

The memory systems 1306 can be implemented as one or more computer-readable or machine-readable storage media. Note that while in the example implementation of FIG. 13 memory systems 1306 is depicted as within computer system 1301A, in some implementations, memory systems 1306 may be distributed within and/or across multiple internal and/or external enclosures of computing system 1301A and/or additional computing systems. Memory systems 1306 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLU-RAY® disks, or other types of optical storage, or other types of storage devices. Note that the instructions discussed above can be provided on one computer-readable or machine-readable storage medium, or can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In some implementations, computing system 1300 contains one or more biased, dual-state, DPCM module(s) 1308. In some implementations, a single biased, dual-state, DPCM module 1308 may be used to perform at least some aspects of one or more implementations of the methods. In other implementations, a plurality of biased, dual-state, DPCM modules 1308 may be used to perform at least some aspects of the methods.

It should be appreciated that computing system 1300 is one example of a computing system, and that computing system 1300 may have more or fewer components than shown, may combine additional components not depicted in the example implementation of FIG. 13, and/or computing system 1300 may have a different configuration or arrangement of the components depicted in FIG. 13. The various components shown in FIG. 13 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the invention.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. As used herein, the term "at least one of A and B" with respect to a listing of items such as, for example, A and B, means A alone, B alone, or A and B. Those skilled in the art will recognize that these and other variations are possible. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method, comprising:
   receiving a first cycle of an original cyclic signal;
   estimating one or more cyclic parameters of the first cycle of the original cyclic signal;
   predicting the original cyclic signal in counts, based at least partially upon the one or more cyclic parameters and one or more sensor parameters, to produce a predicted cyclic signal that corresponds to the original cyclic signal, wherein the predicted cyclic signal comprises biased, dual-state, differential pulse-code modulation (DPCM) data; and
   predicting a second cycle of the original cyclic signal based upon the predicted cyclic signal.

2. The method of claim 1, wherein the one or more cyclic parameters comprise a cosine function that corresponds to the original cyclic signal, the cosine function comprising A cos ωt+θ, where A represents magnitude, w represents frequency, t represents time, and θ represents phase.

3. The method of claim 1, wherein the one or more sensor parameters are selected from the group consisting of a maximum voltage of the original cyclic signal, a minimum voltage of the original cyclic signal, a sampling frequency of the original cyclic signal, a number of bits of an analog-to-digital converter (ADC) that processes the original cyclic signal, and a combination thereof.

4. The method of claim 1, further comprising determining one or more delta values that represent differences between the first cycle of the predicted cyclic signal and the second cycle of the original cyclic signal.

5. The method of claim 4, further comprising determining a low-bit state of the original cyclic signal and a high-bit state of the original cyclic signal based at least partially upon the one or more delta values.

6. The method of claim 5, wherein the low-bit state is represented by µ−τ<x<µ+τ, wherein µ represents a mean or peak value of the one or more delta values, τ represents a boundary threshold, and x represents one of the one or more delta values to be encoded.

7. The method of claim 5, wherein the high-bit state is represented by $$\begin{cases} x < \mu - \tau \\ x > \mu + \tau \end{cases},$$

wherein µ represents a mean or peak value of the one or more delta values, τ represents a boundary threshold, and x represents one of the one or more delta values to be encoded.

8. The method of claim 5, wherein the low-bit state and the high-bit state change dynamically with each cycle of the original cyclic signal in response to the one or more delta values changing.

9. The method of claim 5, further comprising encoding the one or more delta values for the second cycle of the original cyclic signal.

10. The method of claim 9, further comprising switching an encoder to a DPCM with a fixed-bit format in response to a probability of the low-bit state being less than τ.

11. The method of claim 9, further comprising switching an encoder to a DPCM with a fixed-bit format in response to a probability of state_n+1=low|state_n=low being less than λ, where λ represents a threshold.

12. A method, comprising:
   receiving a first cycle of an original cyclic signal;
   estimating one or more cyclic parameters of the first cycle of the original cyclic signal, wherein the one or more cyclic parameters comprise a sine function or a cosine function that corresponds to the original cyclic signal;
   predicting the original cyclic signal in counts, based at least partially upon the one or more cyclic parameters and one or more sensor parameters, to produce a predicted cyclic signal that corresponds to the original cyclic signal, wherein the predicted cyclic signal comprises biased, dual-state, differential pulse-code modulation (DPCM) data, wherein the one or more sensor parameters are selected from the group consisting of a maximum voltage of the original cyclic signal, a minimum voltage of the original cyclic signal, a sampling frequency of the original cyclic signal, a number of bits of an analog-to-digital converter (ADC) that processes the original cyclic signal, and a combination thereof;
predicting a second cycle of the original cyclic signal based upon the predicted cyclic signal; and
determining one or more delta values of the original cyclic signal that represent differences between the first cycle of the predicted cyclic signal and the second cycle of the original cyclic signal.

13. The method of claim 12, further comprising determining a low-bit state of the original cyclic signal and a high-bit state of the original cyclic signal based at least partially upon the one or more delta values, wherein the low-bit state and the high-bit state change dynamically with each cycle of the original cyclic signal in response to the one or more delta values changing.

14. The method of claim 13, wherein the low-bit state is represented by $\mu-\tau < x < \mu+\tau$, wherein $\mu$ represents a mean or peak value of the one or more delta values, $\tau$ represents a boundary threshold, and x represents one of the one or more delta values to be encoded.

15. The method of claim 14, wherein the high-bit state is represented by $$\begin{cases} x < \mu - \tau \\ x > \mu + \tau \end{cases}.$$

16. The method of claim 13, further comprising encoding the one or more delta values for the second cycle of the original cyclic signal.

17. The method of claim 16, further comprising switching an encoder to a differential pulse-code modulation (DPCM) with a fixed-bit format in response to a probability of the low-bit state being less than $\tau$.

18. The method of claim 16, further comprising switching an encoder to a differential pulse-code modulation (DPCM) with a fixed-bit format in response to a probability of state_n+1=low|state_n=low being less than $\lambda$, where $\lambda$, represents a threshold.

19. A method, comprising:
receiving a first cycle of an original cyclic signal that is measured by one or more sensors;
estimating one or more cyclic parameters of the first cycle of the original cyclic signal, wherein the one or more cyclic parameters comprise a cosine function that corresponds to the original cyclic signal, the cosine function comprising A cos $\omega t+\theta$, where A represents magnitude, $\omega$ represents frequency, t represents time, and $\theta$ represents phase;
predicting the original cyclic signal in counts, based at least partially upon the one or more cyclic parameters and one or more sensor parameters, to produce a predicted cyclic signal that corresponds to the original cyclic signal, wherein the predicted cyclic signal comprises biased, dual-state, differential pulse-code modulation (DPCM) data, wherein the predicted cyclic signal comprises at least 3 times fewer bits than the original cyclic signal, and wherein the one or more sensor parameters are selected from the group consisting of a maximum voltage of the original cyclic signal, a minimum voltage of the original cyclic signal, a sampling frequency of the original cyclic signal, a number of bits of an analog-to-digital converter (ADC) that processes the original cyclic signal, and a combination thereof;
predicting a second cycle of the original cyclic signal based upon the predicted cyclic signal; and
determining one or more delta values of the original cyclic signal that represent the first cycle of the predicted cyclic signal subtracted from the second cycle of the original cyclic signal.

20. The method of claim 19, wherein any errors are not propagated because the one or more delta values are independent from one another.

21. A system, comprising:
a sensor configure to measure a first cycle of an original cyclic signal; and
a computing system configured to receive the first cycle of the original cyclic signal from the sensor, the computing system comprising:
one or more processors; and
a memory system comprising one or more non-transitory computer-readable media storing instructions that, when executed by at least one of the one or more processors, cause the computing system to perform operations, the operations comprising:
estimating one or more cyclic parameters of the first cycle of the original cyclic signal;
predicting the original cyclic signal in counts, based at least partially upon the one or more cyclic parameters and one or more sensor parameters, to produce a predicted cyclic signal that corresponds to the original cyclic signal, wherein the predicted cyclic signal comprises biased, dual-state, differential pulse-code modulation (DPCM) data; and
predicting a second cycle of the original cyclic signal based upon the predicted cyclic signal.

22. The system of claim 21, wherein the one or more cyclic parameters comprise a cosine function that corresponds to the original cyclic signal, the cosine function comprising A cos $\omega t+\theta$, where A represents magnitude, $\omega$ represents frequency, t represents time, and $\theta$ represents phase, and wherein the one or more sensor parameters are selected from the group consisting of a maximum voltage of the original cyclic signal, a minimum voltage of the original cyclic signal, a sampling frequency of the original cyclic signal, a number of bits of an analog-to-digital converter (ADC) that processes the original cyclic signal, and a combination thereof.

23. The system of claim 21, wherein the operations further comprise:
determining one or more delta values of the original cyclic signal that represent differences between the first cycle of the predicted cyclic signal and the second cycle of the original cyclic signal; and
determining a low-bit state of the original cyclic signal and a high-bit state of the original cyclic signal based at least partially upon the one or more delta values.

24. The system of claim 23, wherein:
the low-bit state is represented by $\mu-\tau < x < \mu+\tau$;
the high-bit state is represented by $$\begin{cases} x < \mu - \tau \\ x > \mu + \tau \end{cases},$$

wherein µ represents a mean or peak value of the one or more delta values, τ represents a boundary threshold, and x represents one of the one or more delta values to be encoded; and the low-bit state and the high-bit state change dynamically with each cycle of the original cyclic signal in response to the one or more delta values changing.

25. The system of claim 23, wherein the operations further comprise:

encoding the one or more delta values for the second cycle of the original cyclic signal; and switching an encoder to a DCPM with a fixed-bit format in response to a probability of the low-bit state being less than τ; or switching the encoder to the DCPM with the fixed-bit format in response to a probability of state_n+1=low|state_n=low) being less than λ, where λ, represents a threshold.

* * * * *